US008242432B2

(12) United States Patent
Feng et al.

(10) Patent No.: US 8,242,432 B2
(45) Date of Patent: Aug. 14, 2012

(54) SYSTEM HAVING LIGHT SENSOR WITH ENHANCED SENSITIVITY INCLUDING A MULTIPLICATION LAYER FOR GENERATING ADDITIONAL ELECTRONS

(75) Inventors: Dazeng Feng, Arcadia, CA (US); Mehdi Asghari, San Marino, CA (US)

(73) Assignee: Kotura, Inc., Monterey Park, CA (US)

( * ) Notice: Subject to any disclaimer, the term of this patent is extended or adjusted under 35 U.S.C. 154(b) by 343 days.

(21) Appl. No.: 12/589,501

(22) Filed: Oct. 23, 2009

(65) Prior Publication Data
US 2011/0095167 A1    Apr. 28, 2011

(51) Int. Cl.
*G01J 1/04*    (2006.01)
(52) U.S. Cl. .................. 250/227.11; 250/214 R
(58) Field of Classification Search ............ 250/227.11, 250/214.1, 214 R, 214 A, 214 LA; 385/131, 385/2, 24, 130, 132; 257/187–195, 436–466
See application file for complete search history.

(56) References Cited

U.S. PATENT DOCUMENTS

| 3,242,805 | A |   | 3/1966  | Harrick        |
|-----------|---|---|---------|----------------|
| 3,753,157 | A |   | 8/1973  | Ash            |
| 4,784,452 | A |   | 11/1988 | Hodge          |
| 4,899,200 | A |   | 2/1990  | Shur           |
| 4,923,264 | A |   | 5/1990  | Langer         |
| 5,159,700 | A |   | 10/1992 | Reid           |
| 5,285,514 | A | * | 2/1994  | Nojiri et al. ........... 385/131 |
| 5,448,536 | A |   | 9/1995  | Muranishi      |
| 5,642,371 | A |   | 6/1997  | Tohyama        |
| 5,866,936 | A |   | 2/1999  | Hasnain        |
| 5,963,358 | A |   | 10/1999 | Shields        |
| 6,104,047 | A |   | 8/2000  | Watanabe       |
| 6,114,088 | A |   | 9/2000  | Wolk           |
| 6,924,510 | B2 |  | 8/2005  | Gardner        |
| 6,978,067 | B2 |  | 12/2005 | Herbert        |
| 7,120,350 | B2 |  | 10/2006 | Block          |
| 7,308,166 | B1 |  | 12/2007 | Peng           |
| 7,339,724 | B2 |  | 3/2008  | Hochberg       |
| 7,643,714 | B2 |  | 1/2010  | Hochberg       |
| 2002/0074555 | A1 | | 6/2002 | Kim            |
| 2002/0117697 | A1 | | 8/2002 | Tanaka         |
| 2002/0181067 | A1 | | 12/2002 | Romanovsky    |
| 2002/0191916 | A1 | | 12/2002 | Frish          |
| 2003/0016896 | A1 | | 1/2003  | Azarbar        |
| 2003/0164444 | A1 | | 9/2003  | Yoneda         |
| 2005/0018276 | A1 | | 1/2005  | Kourogi        |

(Continued)

OTHER PUBLICATIONS

Coldren, et al., Diode Lasers and Photonic Integrated Circuits, Wiley Series in Microwave and Optical Engineering (1995) p. 355-359.

(Continued)

*Primary Examiner* — Que T Le
(74) *Attorney, Agent, or Firm* — Gavrilovich, Dodd & Lindsey, LLP

(57) ABSTRACT

The optical device includes a waveguide and a light sensor on a base. The light sensor includes a ridge extending from slab regions positioned on opposing sides of the ridge. The ridge includes a multiplication layer and an absorption layer. The absorption layer is positioned to receive at least a portion of the light signal from the waveguide. Additionally, the absorption layer generates a hole and electron pair in response to receiving a photon of the light signal. The multiplication layer is positioned to receive the electron generated in the absorption layer and to generate additional electrons in response to receiving the electron.

20 Claims, 5 Drawing Sheets

U.S. PATENT DOCUMENTS

| | | |
|---|---|---|
| 2005/0025443 A1 | 2/2005 | Nakaji |
| 2005/0167709 A1 | 8/2005 | Augusto |
| 2006/0039666 A1 | 2/2006 | Knights |
| 2008/0272391 A1 | 11/2008 | Kapur |
| 2009/0022452 A1 | 1/2009 | Welch |
| 2011/0095167 A1 | 4/2011 | Feng |

OTHER PUBLICATIONS

Dai, et al., "Resonant Normal-Incidence Separate-Absorption-Charge-Multiplication Ge/Si Avalanche Photodiodes," Sep. 14, 2009/ vol. 17, No. 19/Optics Express, pp. 1-9.

Liu, et al., "Design of Monolithically Integrated GeSi Electro-Absorption Modulators and Photodetectors on an SOI Platform," Jan. 22, 2006/ vol. 15, No. 2/Optics Express, pp. 1-6.

Liu, et al., "Waveguide-Integrated, Ultralow-Energy GeSi Electroabsorption Modulators," Nature photonics/vol. 2/ Jul. 2008, pp. 433-437.

Zaoul, et al., "Origin of the Gain-Bandwidth-Product Enhancement in Separate-Absorption-Charge-Multiplication Ge/Si Avalanche Photodiodes," OSA/OFC/NFOEC, pp. 1-3 (2009).

D. Ahn, C-Y. Hong, J. Liu, W. Giziewics, M. Beals, L. C. Kimerling, and J. Michel, *High performance, waveguide integrated Ge photodetectors*, Opt. Express, 15, 3916 (2007).

Jutzi et al., *Ge-on-So vertical incidence Photodiodes with 39-GHz Bandwidth*, IEEE Photonics TechnologyLetters, vol. 17, No. 7, Jul. 2005 (pp. 1510-1512).

Liu et al., *Tensile strained Ge p-l-n. photodetectors on Si platform for C and L band telecommunications*, Appl. Phys. Lett. 87, 011110 (2005) (pp. 1-3).

Rouviere et al., *Integration of germanium waveguide photodetectors for intrachip optical interconnects*, Optical Engineering 44(7), 075402 (Jul. 2005) (pp. 1-5).

Vivien et al., *High speed and high responsivity germanium photodetector integrated in a Silicon-On-Insulator microwaveguide*, Jul. 23, 2007/ vol. 15, No. 15/Optics Express (pp. 9843-5).

L. Vivien, J. Osmond, J.-M. Fedeli, D. Marris-Morini, P. Crozat, J.-F. Damlencourt, E. Cassan, Y. Lecunff, S. Laval, *42 GHz p.i.n Germanium photodetector integrated in a silicon-on-inculator waveguide*, Opt. Express 17, 6252 (2008).

J. Wang, W. Y. Loh, K. T. Chua, H. Zang, Y. Z. Xiong, S. M. F. Tan, M. B. Yu, S. J. Lee, G. Q. Lo, and D. L. Kwong, *Low-voltage high-speed (18GHz/1V) evanescent-coupled thin-file-Ge lateral PIN photodetectors integrated on Si waveguide*, IEEE Photon. Technol. Lett., 17, 1485 (2008).

Yin et al., *31GHz Ge n-l-p waveguide photodetectors on Sililcon-on-Insulator substrate*, Oct. 17, 2007/Vpl. 15, No. 21/Optics Express (pp. 13965-13971).

The International Search Report and Written Opinion of the International Search Authority as extracted from PCT/US2010/000367, Mar. 23, 2010.

The International Search Report and Written Opinion of the International Search Authority as extracted from PCT/US2010/002512, Jan. 31, 2012.

The International Search Report and Written Opinion of the International Search Authority as extracted from PCT/US2011/001081, Nov. 8, 2011.

* cited by examiner

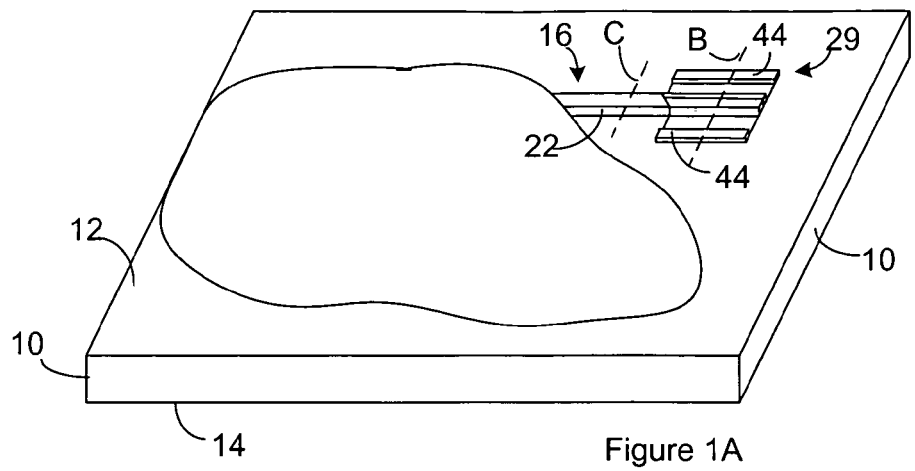
Figure 1A
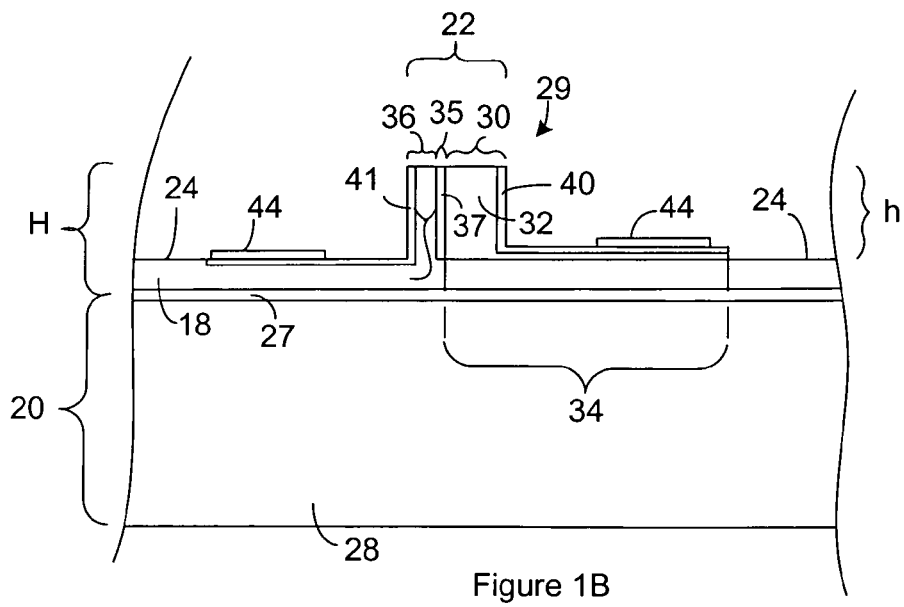
Figure 1B
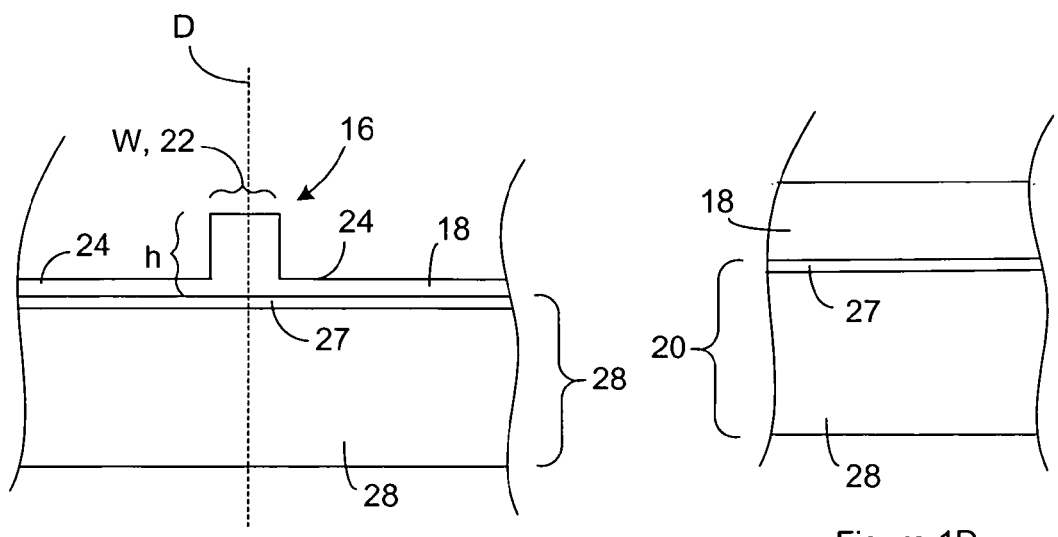
Figure 1C
Figure 1D

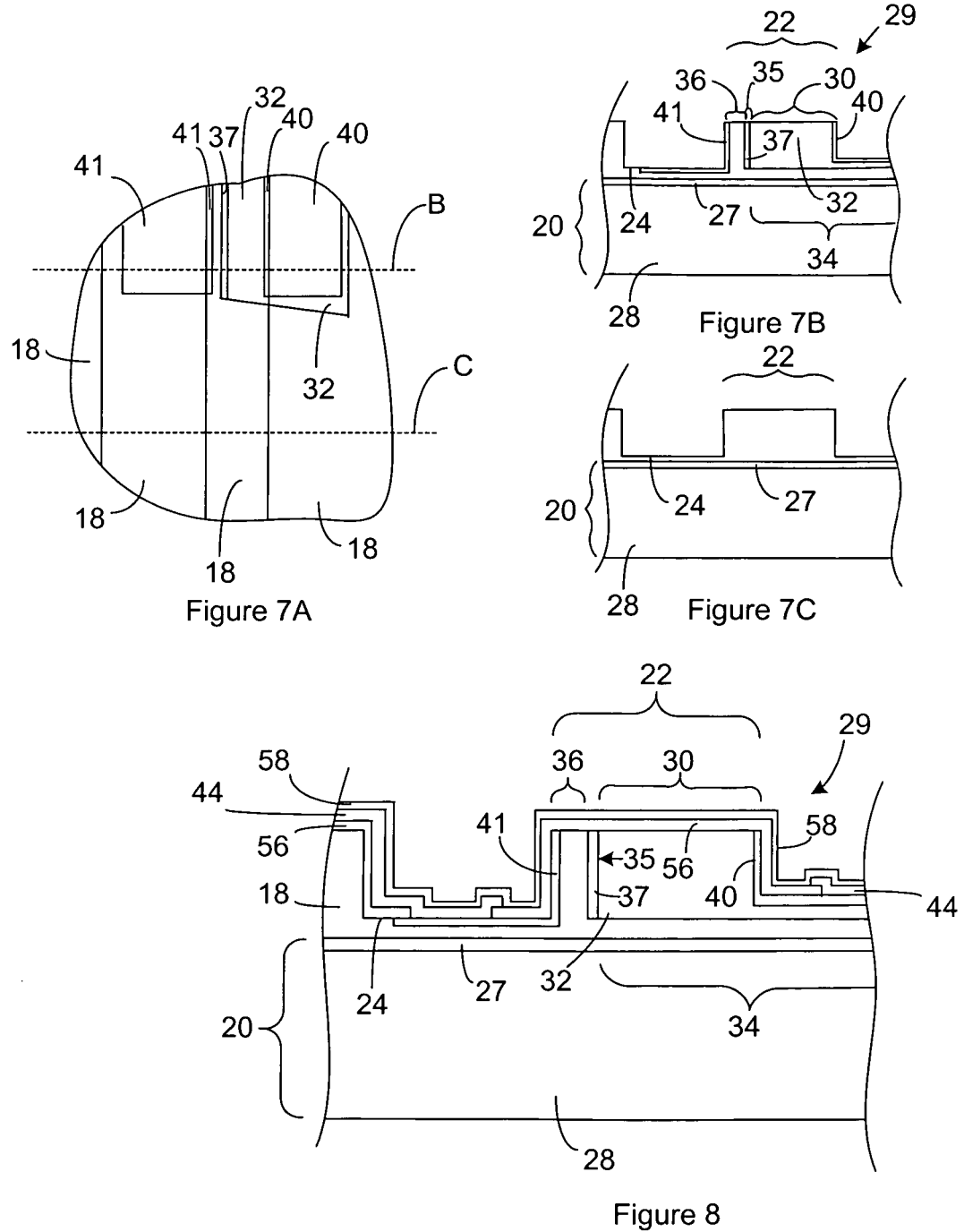

SYSTEM HAVING LIGHT SENSOR WITH ENHANCED SENSITIVITY INCLUDING A MULTIPLICATION LAYER FOR GENERATING ADDITIONAL ELECTRONS

RELATED APPLICATIONS

This application is related to U.S. patent application Ser. No. 12/380,016, filed on Feb. 19, 2009, entitled "Optical Device Having Light Sensor Employing Horizontal Electrical Field", and incorporated herein in its entirety.

FIELD

The present invention relates to optical devices and more particularly to devices having a light sensor.

BACKGROUND

The use of optical and/or optoelectronic devices is increasing in communications applications. These devices can include light sensors that receive light signals from a waveguide. These light sensors often employ a light-absorbing material that absorbs the received light signals. During operation of the light sensor, an electrical field is applied across the light-absorbing material. When the light-absorbing material absorbs a light signal, an electrical current flows through the light-absorbing material. As a result, the level of electrical current through the light-absorbing material indicates the intensity of light signals being received by the light-absorbing material.

The waveguides on optical and/or optoelectronic devices are often made of silicon. Because silicon does not absorb the light signals having the wavelengths that are used in communications applications, silicon is often not effective for use as the light-absorbing medium in the light sensors for communications application. In contrast, germanium is a material that can absorb these light signals and is accordingly often used as the light-absorbing medium in the light sensors for communications application.

These light sensors have been able to achieve adequate speeds when the waveguides have a cross-section with submicron dimensions. However, these light sensors are associated with undesirably high optical loss when used with waveguides having these dimensions. Further, the waveguides used in many communications applications employ larger waveguides. When these light sensors are used with larger waveguides, they generally lose speed and become associated with undesirable levels of dark current. Further, these light sensors can have an undesirably low sensitivity at low light levels.

For the above reasons, there is a need for improved light sensors.

SUMMARY

The optical device includes a waveguide and a light sensor on a base. The light sensor includes a ridge extending from slab regions positioned on opposing sides of the ridge. The ridge includes a multiplication layer and an absorption layer. The absorption layer is positioned to receive at least a portion of the light signal from the waveguide. Additionally, the absorption layer generates a hole and electron pair in response to receiving a photon of the light signal. The multiplication layer is positioned to receive the electron generated in the absorption layer and to generate additional electrons in response to receiving the electron.

The device can also include field sources that serve as sources of an electrical field in the ridge. The field sources can be configured such that the electrical field is substantially parallel to the base. For instance, in some instances, the ridge includes lateral sides between a top and the slab regions. The field sources can each contact one of the lateral sides and the lateral sides that are contacted by the field sources can be on opposing sides of the light-absorbing medium. As a result, the resulting electrical field can travel between the lateral sides of the ridge.

BRIEF DESCRIPTION OF THE FIGURES

FIG. 1A through FIG. 1D illustrate an optical device having a light sensor configured to receive light signals from a waveguide. FIG. 1A is a perspective view of the device.

FIG. 1B is a cross-section of the device shown in FIG. 1A taken along the line labeled B.

FIG. 1C is a cross-section of the device shown in FIG. 1A taken along the line labeled C.

FIG. 1D is a cross-section of the optical device shown in FIG. 1C taken along the line labeled C and extending parallel to the longitudinal axis of the waveguide.

FIG. 3A is a topview of the device precursor.

FIG. 3B is a cross-section of the device precursor shown in FIG. 3A taken along the line labeled B.

FIG. 3C is a cross-section of the device precursor shown in FIG. 3A taken along the line labeled C.

FIG. 4A is a topview of the device precursor.

FIG. 4B is a cross-section of the device precursor shown in FIG. 4A taken along the line labeled B.

FIG. 4C is a cross-section of the device precursor shown in FIG. 4A taken along the line labeled C.

FIG. 5A is a topview of the device precursor.

FIG. 5B is a cross-section of the device precursor shown in FIG. 5A taken along the line labeled B.

FIG. 5C is a cross-section of the device precursor shown in FIG. 5A taken along the line labeled C.

FIG. 7A through FIG. 7C illustrate doped regions formed in the device precursor of FIG. 6A through FIG. 6C. FIG. 7A is a topview of the device precursor.

FIG. 7B is a cross-section of the device precursor shown in FIG. 7A taken along the line labeled B.

FIG. 7C is a cross-section of the device precursor shown in FIG. 7A taken along the line labeled C.

FIG. 8 illustrates a first cladding, metal conductors, and a second cladding formed on a device precursor.

DESCRIPTION

Figure 2:
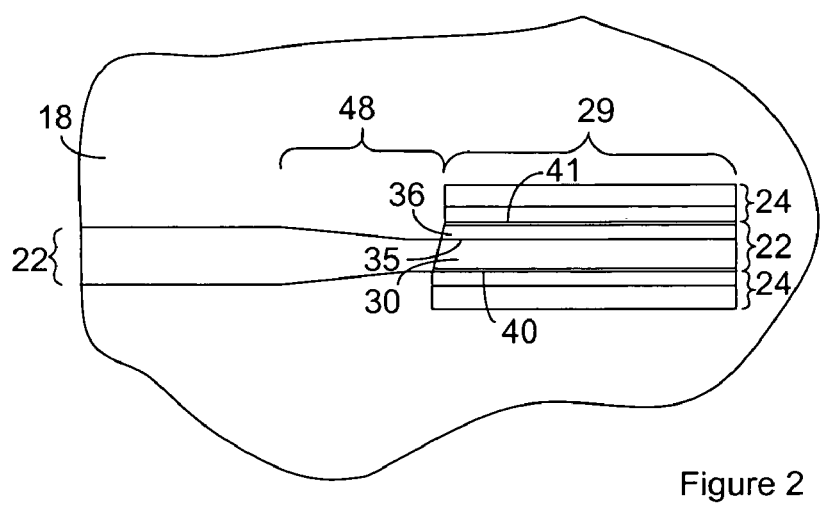
FIG. 2 is a topview of an optical device where the waveguide includes a horizontal taper.

The optical device includes a light-transmitting medium on a base. The device also includes a waveguide configured to guide a light signal through the light-transmitting medium.

The optical device also includes a light sensor. The light sensor includes a ridge extending from slab regions positioned on opposing sides of the ridge. The ridge includes a multiplication layer and an absorption layer. The absorption layer is positioned to receive at least a portion of the light signal from the waveguide. Additionally, the absorption layer generates a hole and electron pair in response to receiving a photon of the light signal. The multiplication layer is positioned to receive the electron generated in the absorption layer and to generate additional electrons in response to receiving the electron. This ability of the light sensor to generate multiple electrons in response to the receipt of a single photon enhances the sensitivity of the light sensor.

Additionally, the light sensor includes field sources for generating an electrical field in the ridge during the operation of the light sensor. As will become evident below, this electrical field may interact with an interface between the light-transmitting medium and the light-absorbing medium in the light sensor. The interaction between the electrical field and this interface is a source of dark current in the light sensor. The field sources can be positioned such that the electrical field is substantially parallel to the base and accordingly also substantially parallel to this interface. Forming the electrical field parallel to this interface can reduce dark current in the light sensor. As a result, the light sensor can be associated with both reduced dark current and increased sensitivity.

Additionally, the width of the waveguide can be tapered before the light signal enters the light-absorbing medium. As a result, the light-absorbing medium can have a width that is smaller than the width of the waveguide. The reduced width increases the speed of the light sensor. Accordingly, even when used with waveguide sizes that are common in communications applications, the light sensor can have desirable levels of speed and dark current while also having the reduced optical loss associated with light sensors built on larger waveguides.

FIG. 1A through FIG. 1D illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the waveguide. For instance, FIG. 1C is a cross-section of the device shown in FIG. 1A taken along the line labeled C. FIG. 1D is a cross-section of the optical device shown in FIG. 1C taken along the line labeled C and extending parallel to the longitudinal axis of the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 extending upward from slab regions of the light-transmitting medium 18. In some instances, the top of the slab regions are defined by the bottom of trenches 24 extending partially into the light-transmitting medium 18 or through the light-transmitting medium 18. Suitable light-transmitting media 18 include, but are not limited to, silicon, polymers, silica, SiN, GaAs, InP and LiNbO$_3$. One or more cladding layers are optionally positioned on the light-transmitting medium 18. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO$_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 1A illustrates a waveguide 16 carrying the light signal between the one or more components and the light sensor 29, the device can be constructed such that the waveguide 16 carries the light signal directly from an optical fiber to the light sensor 29.

The light sensor 29 includes a ridge 22 extending from slab regions positioned on opposing sides of the ridge 22. The tops of the slab regions are defined by the bottom of trenches 24 on opposing sides of the ridge 22. The ridge 22 includes an absorption layer 30. For instance, FIG. 1B shows a light-absorbing medium 32 that absorbs light signals serving as the absorption layer 30. Suitable light-absorbing media include media that upon being exposed to an electrical field, produce an electron and hole pair in response to receiving a photon. Examples of light-absorbing media 32 that are suitable for detection of light signals in at the wavelengths commonly employed in communications applications includes, but are not limited to, germanium, silicon germanium, silicon germanium quantum well, GaAs, and InP. Germanium is suitable for detection of light signals having wavelengths in a range of 1300 nm to 1600 nm.

The absorption layer is positioned to receive at least a portion of a light signal traveling along the waveguide 16. As is evident from FIG. 1A, there is an interface between a facet of the light-absorbing medium 32 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The absorption layer 30 can be positioned on a seed portion 34 of the light-transmitting medium 18. In particular, the light-absorbing medium 32 of the light sensor 29 can be positioned on a seed portion 34 of the light-transmitting medium 18. The seed portion 34 of the light-transmitting medium 18 is positioned on the base 20. In particular, the seed portion 34 of the light-transmitting medium 18 contacts the insulator 27. The seed portion 34 of the light-transmitting medium 18 can be continuous with the light-transmitting medium 18 included in the waveguide 16 or spaced apart from the waveguide 16. When the light signal enters the light sensor, a portion of the light signal can enter the seed portion 34 of the light-transmitting medium 18 and another portion of the light signal enters the light-absorbing medium 32. Accordingly, the light-absorbing medium 32 can receive only a portion of the light signal. In some instances, the light sensor can be configured such that the light-absorbing medium 32 receives the entire light signal.

As will become evident below, during the fabrication of the device, the seed portion 34 of the light-transmitting medium 18 can be used to grow the light-absorbing medium 32. For instance, when the light-transmitting medium 18 is silicon and the light-absorbing medium 32 is germanium, the germanium can be grown on the silicon. As a result, the use of the light-transmitting medium 18 in both the waveguides 16 and as a seed layer for growth of the light-absorbing medium 32 can simplify the process for fabricating the device.

The light sensor also includes a charge layer 35 between a portion of multiplication layer 36 and the absorption layer 30. At least a portion of the multiplication layer 36 is positioned such that the absorption layer 30 is not located between the portion of the multiplication layer 36 and the base 20. For instance, the portion of the multiplication layer 36 can contact the base 20. In some instances, the multiplication layer 36 is positioned such that none of the absorption layer 30 is between the base 20 and the multiplication layer 36. As a result, the multiplication layer 36 and the absorption layer 30 can be positioned adjacent to one another on the base 20. Further, the multiplication layer 36 and the absorption layer 30 can be positioned adjacent to one another such that a line that is parallel to the top and/or bottom of the base 20 extends through both the multiplication layer 36 and the absorption layer 30.

Although the multiplication layer 36 is shown as a single layer of material, the multiplication layer 36 can include multiple layers of material. Suitable materials for the multiplication layer 36 include, but are not limited to, materials that upon being exposed to an electrical field and receiving an electron can excite additional electrons. Examples include, but are not limited to, semiconductor materials including crystalline semiconductors such as silicon. As a result, in some instances, the light-transmitting medium 18 and the multiplication layer 36 can be the same material. In FIG. 7B, the light-transmitting medium 18 and the multiplication layer 36 are shown as the same material.

The multiplication layer 36 can include a doped region 37 that serves as the charge layer 35. The multiplication layer 36 can include also include an undoped region 38 positioned such that the doped region 37 of the multiplication layer 36 is between the undoped region 38 of the multiplication layer 36 and the absorption layer 30. The doped region 37 can be an N-type doped region or a P-type doped region. In one example, the multiplication layer 36 is a layer of silicon that includes a region doped with a p-type dopant and the doped region 37 is in contact with the absorption layer 30 as shown in FIG. 1B.

The light-absorbing medium 32 or the absorption layer 30 can include a first doped region 40 that serves as a field source for the electrical field to be formed in the ridge 22. For instance, FIG. 1B illustrates the light-absorbing medium 32 including a first doped region 40 that serves as a field source for the electrical field to be formed in the ridge 22. The first doped region 40 can be continuous and unbroken and can be included both the ridge 22 and in the slab region as is evident from FIG. 1B. In particular, the first doped region 40 can be included both in a lateral side of the ridge 22 and in the slab region. The light-absorbing medium 32 or the absorption layer 30 can also include an undoped region between the multiplication layer 36 and the first doped region 40.

As is evident in FIG. 1B, the portion of the slab region that includes the first doped region 40 can also include or consist of the light-absorbing medium 32. As a result, the first doped region 40 can be formed in a single continuous medium. As an example the first doped region 40 can be formed in germanium that is included both in the ridge 22 and in the slab region. As is evident from FIG. 1B, the first doped region 40 can extend up to the top side of the light-absorbing medium 32. The first doped regions 40 can be an N-type doped region or a P-type doped region.

The multiplication layer 36 can include a second doped region 41 that serves as a field source for the electrical field to be formed in the ridge 22. The second doped region 41 can be continuous and unbroken and can be included both the ridge 22 and in the slab region as is evident from FIG. 1B. In particular, the second doped region 41 can be included both in a lateral side of the ridge 22 and in the slab region. As is evident in FIG. 1B, the portion of the slab region that includes the second doped region 41 can also include or consist of the same material as the multiplication layer 36. As a result, the second doped region 41 can be formed in a single continuous medium. As an example the second doped region 41 can be formed in silicon that is included both in the ridge 22 and in the slab region. As is evident from FIG. 1B, the second doped region 41 can extend up to the top side of the light-absorbing medium 32. The second doped regions 41 can be an N-type doped region or a P-type doped region.

An N-type doped region can include an N-type dopant. A P-type doped region can include a P-type dopant. Suitable dopants for N-type regions include, but are not limited to, phosphorus and/or arsenic. Suitable dopants for P-type regions include, but are not limited to, boron. The first doped region 40 and the second doped region 41 can be doped so as to be electrically conducting. A suitable concentration for the P-type dopant in a P-type doped region that serves as the first doped region 40 or the second doped region 41 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region that serves as the first doped region 40 or the second doped region 41 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

As noted above, a region of the multiplication layer 36 can be an N-type doped region or a P-type doped region that serves as the charge layer 35. Suitable dopants for N-type regions include, but are not limited to, phosphorus and/or arsenic. Suitable dopants for P-type regions include, but are not limited to, boron. Since the doped region 37 serves as the charge layer, that doped region 37 can have a lower concentration of dopant than the first doped region 40 and/or the second doped region 41. For instance, a suitable concentration for the P-type dopant in a doped region 37 that serves as the charge layer 35 includes, but is not limited to, concentrations greater than $1\times10^{15}$ cm$^{-3}$, $1\times10^{16}$ cm$^{-3}$, or $1\times10^{17}$ cm$^{-3}$, and/or less than $1\times10^{19}$ cm$^{-3}$, $1\times10^{20}$ cm$^{-3}$, or $1\times10^{21}$ cm$^{-3}$. A suitable concentration for the N-type dopant in a doped region 37 that serves as the charge layer 35 includes, but is not limited to, concentrations greater than $1\times10^{15}$ cm$^{-3}$, $1\times10^{16}$ cm$^{-3}$, or $1\times10^{17}$ cm$^{-3}$, and/or less than $1\times10^{19}$ cm$^{-3}$, $1\times10^{20}$ cm$^{-3}$, or $1\times10^{21}$ cm$^{-3}$.

In one example, the multiplication layer 36 includes or consists of silicon, the light-absorbing material includes or consists of silicon, the first doped region 40 is an p-type region with a dopant concentration of about $1\times10^{20}$ cm$^{-3}$, the second doped region 41 is an n-type region with a dopant concentration of about $1\times10^{20}$ cm$^{-3}$, and the doped region 37 that serves as the charge layer is a p-type region with a dopant concentration of about $1\times10^{17}$ cm$^{-3}$.

The first doped region 40 and the second doped region 41 are each in contact with an electrical conductor 44 such as a metal. Accordingly, the first doped region 40 provides electrical communication between one of the electrical conductors 44 and the light-absorbing medium 32. In particular, the first doped region 40 provides electrical communication between an electrical conductor 44 and the light-absorbing medium 32 included in a lateral side of the ridge 22. The second doped region 41 provides electrical communication between one of the electrical conductors 44 and the multiplication layer 36. In particular, the second doped region 41 provides electrical communication between one of the electrical conductors 44 and the portion of the multiplication layer 36 at the lateral side of the ridge 22.

During operation of the light sensor, electronics (not shown) in electrical communication with the electrical contacts are used to apply a reverse bias between the first doped region 40 and the second doped region 41. When the first doped region 40 is a p-type region, the second doped region 41 is an n-type region, and the doped region 37 that serves as the charge layer is a p-type region, a positive charge develops at the charge layer 35. As a result, there is an increased electrical field at the charge layer 35. When a photon is absorbed in the undoped region of the absorption layer, a hole and electron pair are generated. The electron is pulled toward the positive charge at the charge layer 35. The increased electrical field at the charge layer causes excites the electron and causes the electron to accelerate. The electron can accelerate to the extent that interaction of the electron with the lattice structure of the multiplication layer 36 excites additional hole and electron pairs. In turn, these electrons may excite further hole and electron pairs. In this way, a single photon results in the creation of multiple electrons. These electrons provide electrical current through the light sensor. The current level can be detected and/or measured by the electronics in order to determine the presence and/or intensity of the light signal. As a result, the creation of these additional electrons from a single photon increases the sensitivity of the light sensor.

The level of doping in the charge layer can affect the operation of the light sensor. For instance, the level of doing in the charge layer can be selected to cause a high level of electric field in the multiplication layer in order to achieve a high gain in the multiplication layer while also providing an electric field in the absorption layer that is low enough to reduce avalanche gain the absorption layer. The low gain in the absorption region can reduce free carriers that can absorb light without generating the electrical current that indicates the presence of light.

The light sensor can be configured to apply an electric field to the light-absorbing medium 32 that is substantially parallel to the base 20. For instance, the light-absorbing medium 32 can include lateral sides 35 that connect a bottom side 36 and a top side 37. The bottom side is located between the top side and the base 20. In some instances, the lateral sides are substantially perpendicular relative to the base 20.

As noted above, the light sensor is suitable for use with waveguide dimensions that are suitable for use in communications applications. Accordingly, a suitable height for the waveguide 16 (labeled h in FIG. 1C) includes, but is not limited to, heights greater than 1 μm, 2 μm, and 3 μm. A suitable width for the waveguide 16 (labeled w in FIG. 1C) includes, but is not limited to, widths greater than 0.5 μm, 2 μm, and 3 μm. Suitable waveguide dimension ratios (width of the waveguide 16:height of the waveguide 16) include, but are not limited to, ratios greater than 0.15:1, 0.5:1, and 1:1 and/or less that 0.25:1, 1:1, and 2:1. A suitable thickness for the slab regions adjacent to the waveguide includes, but is not limited to, a thickness greater than 0.1 μm, 0.5 μm, or 1 μm and/or less than 1.5 μm, 2 μm, or 3 μm.

In the light sensor, a suitable height for the ridge 22 (labeled H in FIG. 1B) includes, but is not limited to, heights greater than 0.5 μm, 1 μm, or 2 μm and/or less than 3.5 μm, 4 μm, or 5 μm. A suitable height for the light-absorbing medium 32 (labeled h in FIG. 1B) includes, but is not limited to, heights greater than 0.5 μm, 1 μm, or 2 μm and/or less than 3.5 μm, 4 μm, or 5 μm. As is evident in FIG. 1B, the slab region that includes the light-absorbing medium 32 can have a thickness that is different from the thickness of the slab region that excludes the light-absorbing medium 32. A suitable thickness for the slab region that includes the light-absorbing medium 32 includes, but is not limited to, a thickness greater than 0.1 μm, 0.5 μm, or 1 μm and/or less than 1.5 μm, 2 μm, or 3 μm. A suitable thickness for the slab region that excludes the light-absorbing medium 32 includes, but is not limited to, a thickness greater than 0.1 μm, 0.5 μm, or 1 μm and/or less than 1.5 μm, 2 μm, or 3 μm.

The width of the light-absorbing medium 32 included in the ridge 22 of the light sensor can affect the performance of the light sensor. For instance, increasing the width of the light-absorbing medium 32 can increase the portion of the light-absorbing medium 32 that receives the light signals from the waveguide 16 and can accordingly increase the efficiency of the light sensor. However, increasing this width can reduce the speed of the light sensor by increasing the distance that the electrons generated in the light-absorbing medium 32 travel through the light-absorbing medium 32. Similarly, the width of the multiplication region can slow the light sensor. As a result, it is desirable for the width of the multiplication region to be less than the width of the light-absorbing region. A suitable width ratio (width of the light-absorbing medium 32:width of the multiplication layer 36) includes widths ratios greater than 0.1:1, 0.5:1, or 1:1 and/or less than 0.12:1, 1.5:1, or 2:1. A suitable width for the light-absorbing medium 32 includes widths greater than 0.1 µm, 0.5 µm, or 1 µm and/or less than 1.5 µm, 2 µm, or 4 µm. A suitable width for the multiplication layer 36 includes widths greater than 0.1 µm, 0.2 µm, or 0.5 µm and/or less than 1 µm, 2 µm, or 3 µm.

In one example of the light sensor, the height for the ridge 22 is 3 µm, the height for the light-absorbing medium 32 is 3 µm, the slab region that includes the light-absorbing medium 32 is 1 µm, and the thickness of the slab region that excludes the light-absorbing medium 32 is 1 µm. In this example, the width of the multiplication region is 0.5 µm and the width of the light-absorbing region is 1.5 µm.

Rather than using first doped region 40 and the second doped region 41 as the field sources, electrical conductors 44 such as metal can be used as the field sources. For instance, the first doped region 40 and the second doped region 41 need not be formed and electrical conductors can be formed over the locations of the first doped region 40 and the second doped region 41. The electrical conductors can then serve as the field sources.

FIG. 2 is a topview of an optical device where the waveguide 16 includes a taper 48. The taper 48 can be a horizontal taper and need not include a vertical taper although a vertical taper is an option. The taper 48 is positioned before the light sensor. For instance, the horizontal taper occurs in the light-transmitting medium 18 rather than in the light-absorbing medium 32. The taper 48 allows the light-absorbing medium 32 to have a narrower width than the waveguide 16. The reduced width of the light-absorbing medium 32 increases the speed of the light sensor. The optical component preferably excludes additional components between the taper and light sensor although other components may be present.

The waveguide can be aligned with the absorption layer 30. For instance, FIG. 2 shows the ridge 22 of the waveguide aligned with the absorption layer without any portion of the ridge being aligned with multiplication layer 36. This alignment can reduce the entry of light signals into the multiplication layer 36 while providing an efficient absorption of the light signal in the absorption layer.

The optical device can be constructed using fabrication technologies that are employed in the fabrication of integrated circuits, optoelectronic circuits, and/or optical devices. For instance, the ridge 22 for the waveguide 16 and/or the seed portion 34 can be formed in the light-transmitting medium 18 using etching technologies on a silicon-on-insulator wafer. Horizontal tapers can be readily formed using masking and etching technologies. Suitable methods for forming vertical tapers are disclosed in U.S. patent application Ser. No. 10/345,709, filed on Jan. 15, 2003, entitled "Controlled Selectivity Etch for Use with Optical Component Fabrication," and incorporated herein in its entirety.

FIG. 3A through FIG. 8 illustrate a method of generating an optical device constructed according to FIG. 1A through FIG. 1C. The method is illustrated using a silicon-on-insulator wafer or chip as the starting precursor for the optical device. However, the method can be adapted to platforms other than the silicon-on-insulator platform.

Figure 3A:
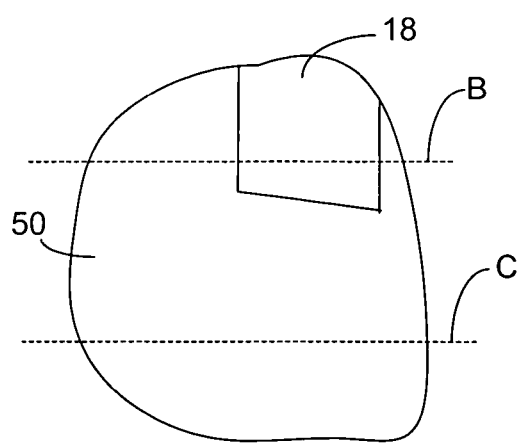
FIG. 3A through FIG. 3C illustrate a first mask formed on the silicon-on-insulator wafer or chip to provide a device precursor.
Figure 3B:
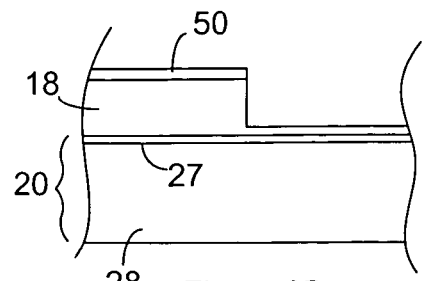
Figure 3C:
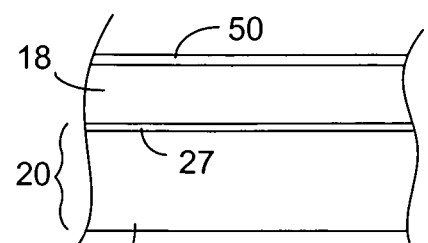

FIG. 3A through FIG. 3C illustrate a first mask 50 formed on the silicon-on-insulator wafer or chip to provide a device precursor. FIG. 3A is a topview of the device precursor. FIG. 3B is a cross-section of the device precursor shown in FIG. 3A taken along the line labeled B. FIG. 3C is a cross-section of the device precursor shown in FIG. 3A taken along the line labeled C. The first mask 50 leaves exposed a region of the device precursor where a sensor cavity is to be formed while the remainder of the illustrated portion of the device precursor is protected. The sensor cavity is the region of the device precursor where the light-absorbing medium 32 and the slab region that includes the light-absorbing medium 32 are to be formed. A first etch is then performed so as to form the sensor cavity. The first etch yields the device precursor of FIG. 3A through FIG. 3C. The first etch is performed such that the seed portion 34 of the light-transmitting medium 18 remains on the base 20. Accordingly, the first etch can optionally be terminated before the base 20 is reached.

A suitable first mask 50 includes, but is not limited to, a hard mask such as a silica mask. A suitable first etch includes, but is not limited to, a dry etch.

Figure 4A:
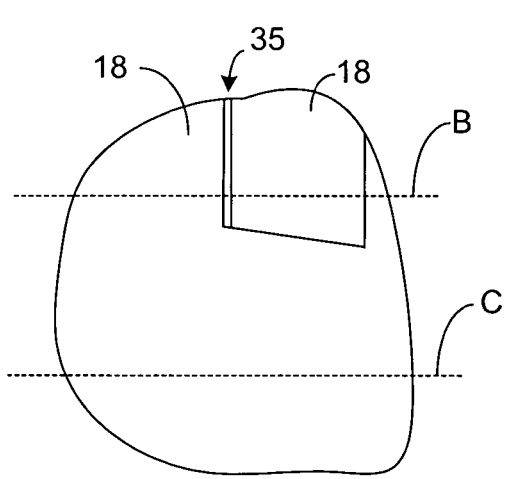
FIG. 4A through FIG. 4C illustrate a charge formed in a sensor cavity in the device precursor of FIG. 3A through FIG. 3C.
Figure 4B:
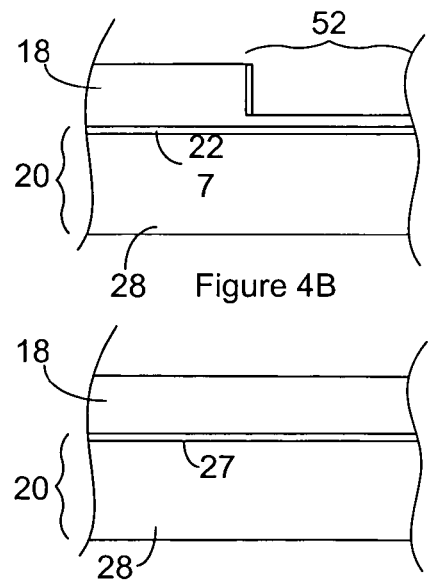
Figure 4C:
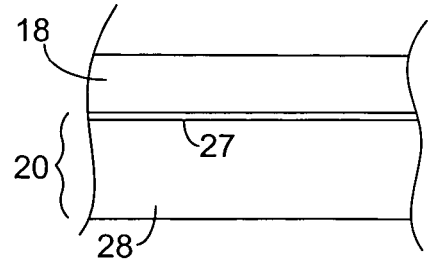

As shown in FIG. 4A through FIG. 4C, the charge layer 35 is formed in the sensor cavity 52 of FIG. 3A through FIG. 3C. FIG. 4A is a topview of the device precursor. FIG. 4B is a cross-section of the device precursor shown in FIG. 4A taken along the line labeled B. FIG. 4C is a cross-section of the device precursor shown in FIG. 4A taken along the line labeled C. The charge layer 35 can be formed by forming the doped region 37 in a vertical wall of the light-transmitting region. The doped region 37 can be generated by forming a doping mask on the device precursor so the locations of the doped region 37 remains exposed and the remainder of the illustrated portion of the device precursor is protected. High angle dopant implant processes can be employed to form the doped region 37. The doping mask can then be removed.

Figure 5A:
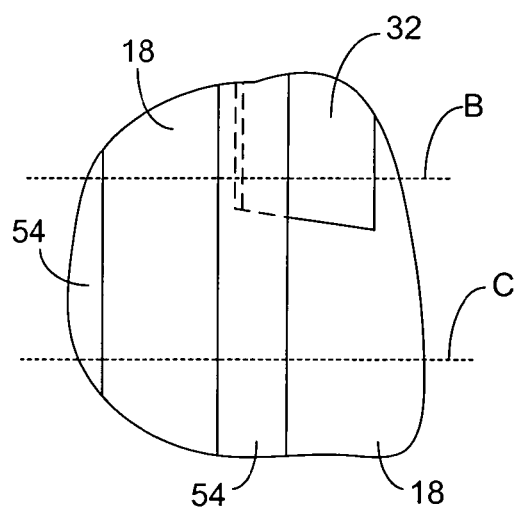
FIG. 5A through FIG. 5C illustrate a light-absorbing medium formed in the sensor cavity of FIG. 4A through FIG. 4C.
Figure 5B:
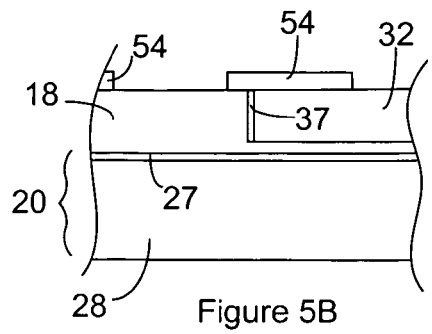
Figure 5C:
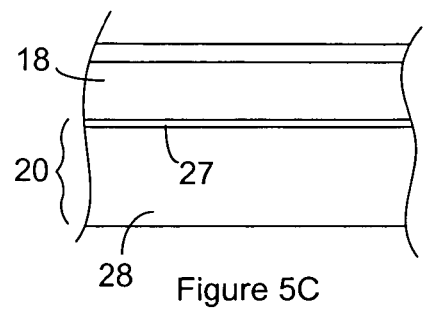

As shown in FIG. 5A through FIG. 5C, the light-absorbing medium 32 is formed in the sensor cavity of FIG. 4A through FIG. 4C. FIG. 5A is a topview of the device precursor. FIG. 5B is a cross-section of the device precursor shown in FIG. 5A taken along the line labeled B. FIG. 5C is a cross-section of the device precursor shown in FIG. 5A taken along the line labeled C. When the light-transmitting medium 18 is silicon and the light-absorbing medium 32 is germanium, the germanium can be grown on the seed portion 34 of the silicon. After formation of the light light-absorbing medium 32, the device precursor can be planarized to provide the device precursor of FIG. 5A through FIG. 5C. An example of a suitable planarization method is a chemical-mechanical polishing (CMP) process.

After planarization of the device precursor, a second mask can be formed on the device precursor as shown in FIG. 5A through FIG. 5C. The second mask 54 is formed such that the regions where the slab regions are to be formed remain exposed while protecting the remainder of the illustrated portion of the device precursor. A suitable second mask 54 includes a hard mask such as a silica mask.

Figure 6A:
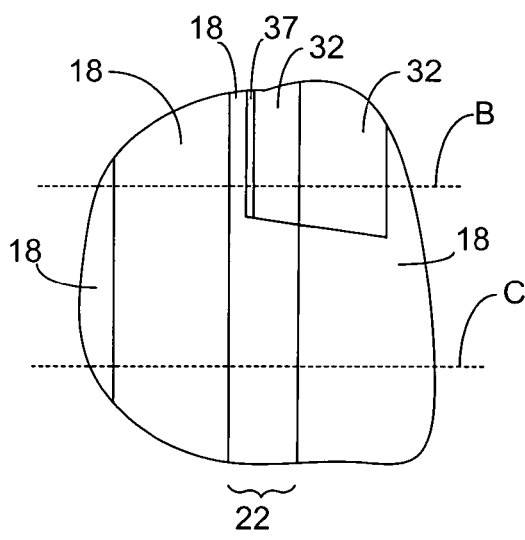
FIG. 6A is a topview of the device precursor of FIG. 5A through FIG. 5C after etching the device precursor.
Figure 6B:
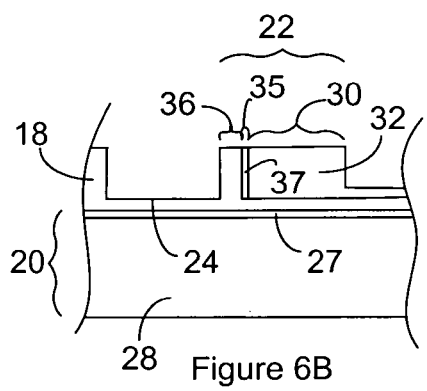
FIG. 6B is a cross-section of the device precursor shown in FIG. 6A taken along the line labeled B.
Figure 6C:
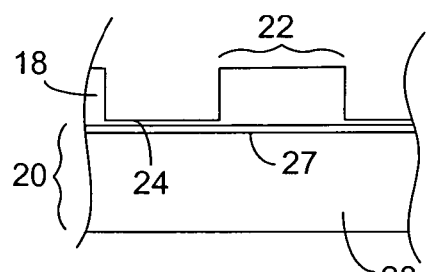
FIG. 6C is a cross-section of the device precursor shown in FIG. 6A taken along the line labeled C.

A second etch is performed on the device precursor of FIG. 5A through FIG. 5C to provide the device precursor of FIG. 6A through FIG. 6C. FIG. 6A is a topview of the device precursor. FIG. 6B is a cross-section of the device precursor shown in FIG. 6A taken along the line labeled B. FIG. 6C is a cross-section of the device precursor shown in FIG. 6A taken along the line labeled C. The second etch is stopped when the slab region that excludes the light-absorbing medium 32 is formed to the desired thickness. Since the second etch etches the light-transmitting medium 18 and the light-absorbing medium 32 concurrently, the second etch may etch the light-transmitting medium 18 and the light-absorbing medium 32 to different depths. As a result, FIG. 7B (and also FIG. 2) illustrates the slab region that includes the light-absorbing medium 32 being formed to a different thickness than the slab region that excludes the light-absorbing medium 32. In one example, the second etch is selected to etch the light-transmitting medium 18 more quickly than the light-absorbing medium 32. As a result, the slab region that includes the light-absorbing medium 32 is illustrated as being thicker than the slab region that excludes the light-absorbing medium 32.

The first doped region 40 and the second doped region 41 can be formed in the device precursor of FIG. 6A through FIG. 6C to provide the device precursor of FIG. 7A through FIG. 7C. FIG. 7A is a topview of the device precursor. FIG. 7B is a cross-section of the device precursor shown in FIG. 7A taken along the line labeled B. FIG. 7C is a cross-section of the device precursor shown in FIG. 7A taken along the line labeled C. The first doped regions 40 can be generated by forming a doping mask on the device precursor so the location of the first doped regions 40 remain exposed and the remainder of the illustrated portion of the device precursor is protected. High angle dopant implant processes can be employed to form the first doped regions 40. The doping mask can then be removed. The same sequence can then be employed to form the second doped region 41. The second doped region 41 can be formed before the first doped region 40 or the first doped region 40 can be formed before the second doped region 41.

A first cladding 56, metal conductors 44, and a second cladding 58 can optionally be formed on the device precursor of FIG. 7A through FIG. 7C to provide the device precursor of FIG. 8. The first cladding can be formed such that the portion of the first doped region 40 and the second doped region 41 that is to be contacted by the electrical conductors 44 remain exposed and the remainder of the illustrated portion of the device precursor are protected by the first cladding. A suitable first cladding includes, but is not limited to, PECVD deposited silica that is subsequently patterned using photolithography. The electrical conductors 44 can be formed on the resulting device precursor. The electrical conductors 44 can be formed so each electrical conductor 44 extends from the first doped region 40 or the second doped region 41, out of the trench 24, and over the light-transmitting medium 18. Suitable electrical conductors 44 include metals such as titanium and aluminum. The metals can be deposited by sputtering and patterned by photolithography. A second cladding can optionally be formed on the resulting device precursor. The second cladding can be patterned such that the second cladding defines contact pads on the electrical conductors 44. Since the contact pads can be positioned outside of the trenches 24, the location of the contact pads is not illustrated in FIG. 8. A suitable second cladding includes, but is not limited to, PECVD deposited SiN that is subsequently patterned using photolithography.

The device can be used in conjunction with electronics that are in electrical communication with the portion of the electrical conductors 44 that act as contact pads. The electronics can apply electrical energy to the contact pads so as to form a reverse bias across the light sensor.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a waveguide on a base, the waveguide configured to guide a light signal through a light-transmitting medium; and
a light sensor positioned on the base,
the light sensor including
a ridge extending upward from slab regions positioned on opposing sides of the ridge,
the ridge including field sources configured to generate an electrical field in the ridge,
the field sources being on opposing lateral sides of the ridge, each one of the lateral sides being between a top of the ridge and the slab regions,
the ridge including a multiplication layer and an absorption layer, the absorption layer is positioned to receive at least a portion of the light signal from the waveguide,
the absorption layer is configured to generate a hole and electron pair in response to receiving a photon of the light signal, and
the multiplication layer positioned to receive the electron generated in the absorption layer and being configured to generate additional electrons in response to receiving the electron.

2. The device of claim 1, wherein the multiplication layer includes the light-transmitting medium.

3. The device of claim 2, wherein a layer of light-transmitting medium is between the base and the absorption layer.

4. The device of claim 1, wherein the multiplication layer consists of the light-transmitting medium.

5. The device of claim 1, wherein the field sources are configured to generate the electrical field such that the electrical field is substantially parallel to the base.

6. The device of claim 1, wherein field sources are each a doped region.

7. The device of claim 6, wherein the absorption layer includes a light-absorbing medium that generates the hole and electron pair in response to receiving the photon and one of the doped regions is a doped region of the light-absorbing medium.

8. The device of claim 7, wherein the doped region of the light-absorbing medium is included both in the ridge and in one of the slab regions.

9. The device of claim 6, wherein the multiplication layer includes a multiplication medium that generates the additional electrons and one of the doped regions is a doped region of the multiplication medium.

10. The device of claim 9, wherein the doped region of the multiplication medium is included both in the ridge and in one of the slab regions.

11. The device of claim 1, wherein the absorption layer includes a light-absorbing medium that generates the hole and electron pair in response to receiving the photon and the light-absorbing medium is germanium.

12. The device of claim 1, wherein the absorption layer includes a light-absorbing medium that generates the hole and electron pair in response to receiving the photon,
the light-absorbing medium being germanium,
the multiplication layer including silicon,
the light-transmitting medium including silicon, and a layer of silicon is between the base and the absorption layer.

13. The device of claim 1, wherein the waveguide is positioned on a top side of the base, and the absorption layer and the multiplication layer being arranged such that a line that is parallel to the top side of the base can extend through both the absorption layer and the multiplication layer.

14. The device of claim 1, wherein the absorption layer contacts the multiplication layer.

15. The device of claim 1, further comprising: a charge layer at an interface between the absorption layer and the multiplication layer.

16. The device of claim 15, wherein the charge layer is a doped region of the multiplication layer.

17. The device of claim 16, wherein the multiplication layer includes silicon and the charge layer is a doped region of the silicon.

18. The device of claim 17, wherein one of the field sources is a doped region of the silicon.

19. The device of claim 18, wherein the absorption region includes germanium and one of the field sources is a doped region of the silicon.

20. The device of claim 19, wherein germanium and the silicon contact one another.

* * * * *